United States Patent
Sunderdiek

(10) Patent No.: US 12,020,547 B2
(45) Date of Patent: *Jun. 25, 2024

(54) CIRCUITRY FOR AUTONOMOUSLY MEASURING ANALOG SIGNALS AND RELATED SYSTEMS, METHODS, AND DEVICES

(71) Applicant: Microchip Technology Incorporated, Chandler, AZ (US)

(72) Inventor: Gregor Hubert Sunderdiek, Trondelag (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/172,180

(22) Filed: Feb. 21, 2023

(65) Prior Publication Data

US 2023/0196894 A1 Jun. 22, 2023

Related U.S. Application Data

(63) Continuation of application No. 17/301,105, filed on Mar. 25, 2021, now Pat. No. 11,587,421.

(60) Provisional application No. 62/705,234, filed on Jun. 17, 2020.

(51) Int. Cl.
*G08B 17/12* (2006.01)
*G08B 1/08* (2006.01)
*H03M 1/34* (2006.01)

(52) U.S. Cl.
CPC .............. *G08B 17/12* (2013.01); *G08B 1/08* (2013.01); *H03M 1/34* (2013.01)

(58) Field of Classification Search
CPC ........ G08B 1/08; G08B 17/10; G08B 17/103; G08B 17/107; G08B 17/11; G08B 17/113; G08B 17/117; G08B 17/12; G08B 17/125; H03M 1/34; H03M 1/12; H03M 1/002
USPC .................................................. 340/627–631
See application file for complete search history.

(56) References Cited

U.S. PATENT DOCUMENTS

| | | | | |
|---|---|---|---|---|
| 4,675,661 A | * | 6/1987 | Ishii ..................... | G01N 21/534 340/630 |
| 9,196,141 B1 | * | 11/2015 | Schmidt ................. | G08B 21/14 |
| 2002/0024436 A1 | * | 2/2002 | Suzuki ................... | G08B 25/14 340/506 |
| 2011/0031419 A1 | * | 2/2011 | Fukui ..................... | H03F 3/087 250/574 |
| 2016/0056828 A1 | | 2/2016 | Ueki | |

OTHER PUBLICATIONS

International Search Report from International Application No. PCT/US2021/070308, dated Jul. 16, 2021, 4 pages.

(Continued)

*Primary Examiner* — Brian Wilson
(74) *Attorney, Agent, or Firm* — TraskBritt

(57) ABSTRACT

Analog signal measurement and related apparatus, systems, and methods are disclosed. Such an apparatus may include a signal analyzing circuitry to enable responsive to the assertion of the first enable signal, compare the amplified analog input signal to one or more threshold values responsive to the assertion of the second enable signal, and generate an alert signal responsive to a determination that the amplified analog input signal falls outside of the one or more threshold values.

23 Claims, 5 Drawing Sheets

(56) References Cited

OTHER PUBLICATIONS

International Written Opinion from International Application No. PCT/US2021/070308, dated Jul. 16, 2021, 11 pages.

* cited by examiner

CIRCUITRY FOR AUTONOMOUSLY MEASURING ANALOG SIGNALS AND RELATED SYSTEMS, METHODS, AND DEVICES

CROSS-REFERENCE TO RELATED APPLICATIONS

This application is a continuation of U.S. patent application Ser. No. 17/301,105, filed Mar. 25, 2021, now U.S. Pat. No. 11,587,421, issued Feb. 21, 2023. This application also claims the benefit under 35 U.S.C. § 119(e) of U.S. Provisional Patent Application No. 62/705,234, filed Jun. 17, 2020, and titled "CIRCUITRY FOR AUTONOMOUSLY MEASURING ANALOG SIGNALS AND RELATED SYSTEMS, METHODS, AND DEVICES," the disclosure of each of which is hereby incorporated herein in its entirety by this reference.

TECHNICAL FIELD

This disclosure relates generally to processing of analog signals using embedded systems, and more specifically to processing of analog signals independently from, and without supervision by, a processing core or central processing unit (CPU).

BACKGROUND

Embedded systems (e.g., microcontrollers) may be used in measuring analog signals. Since embedded systems may be programmed to operate portions thereof in low power or off modes, power savings may be achieved when embedded systems are used to measure analog signals as compared to analog signal measuring systems that remain constantly on.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
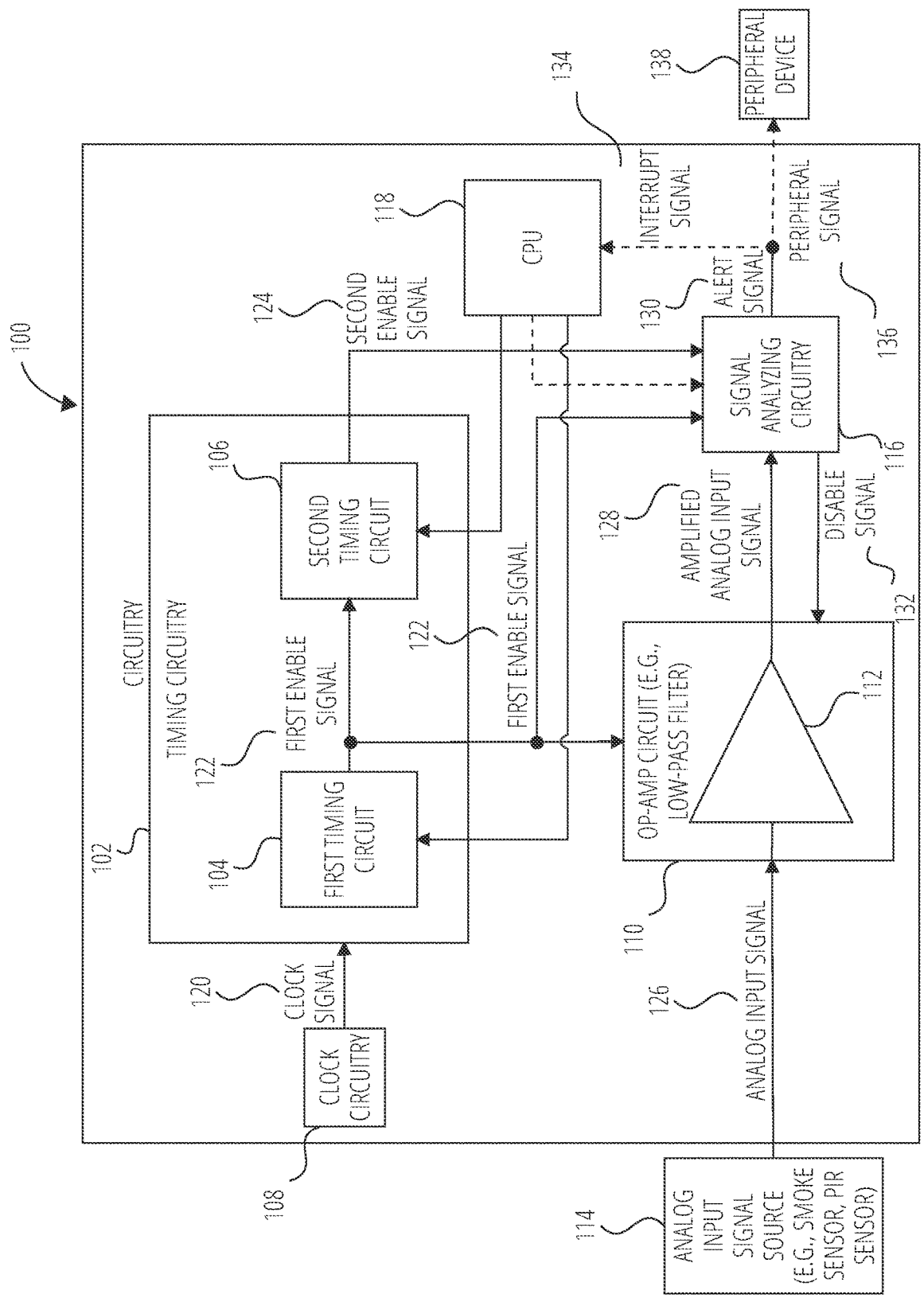
FIG. 1 is a block diagram of circuitry for autonomous measurement of analog signals, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein, as appropriate. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Some analog measuring systems need only periodic measurements in contrast to always on measurements. By way of non-limiting example, a smoke detector may periodically measure a content of smoke in a smoke chamber. Power savings may be achieved by operating the smoke detector in an off, low power, or disabled state for the majority of the time, and enabling circuitry of the smoke detector periodically to perform measurements of the smoke content.

Some embedded systems for measuring analog signals may amplify an analog signal with an operational amplifier (op-amp) circuit and measure the output value of the op-amp circuit with signal analyzing circuitry such as an analog to digital converter (ADC) or an analog comparator. These measurements may be taken periodically (e.g., every two seconds, without limitation). Embedded systems may be programmed to operate the op-amp circuit and signal analyzing circuitry in off, low power, or disabled modes in general, and periodically wake up or enable the op-amp circuit and signal analyzing circuitry to periodically take measurements of the analog signal in order to conserve power. The op-amp circuit and the signal analyzing circuitry may be enabled for only a short period of time (e.g., 100 milliseconds) each measurement period.

Although embedded systems may be programmed to operate portions thereof in low power, off, or disabled modes, enabling and disabling of portions of an embedded system by its processing core (also referred to herein as "central processing unit" or "CPU") may occupy valuable processing bandwidth. For example, in an analog signal measurement system that includes a processing core, an operational amplifier ("op-amp") circuit, and signal analyzing circuitry, the processing core may be programmed (e.g., using firmware code stored by a data storage device, without limitation) to periodically enable and disable the op-amp circuit and the signal analyzing circuitry to measure an analog signal. If the processing core is already occupied with another task (e.g., safety checks, communication, without limitation) when it is time to enable the op-amp circuit and the signal analyzing circuitry, the processing core may be required to interrupt its performance of the other task to enable the op-amp circuit and the signal analyzing circuitry. If the processing core is, on the other hand, itself in a low power, idle, or disabled state, the processing core may be required to power up or enable, to enable the op-amp circuit and the signal analyzing circuitry, which may expend non-negligible power.

Disclosed herein is circuitry for analog measurements that may be performed autonomously, without intervention or supervision from a processing core or CPU. The capability to perform a task (e.g., analog measurement, without limitation) without intervention or supervision from a processing core or CPU is referred to herein as "independence" or being "independent." Although the processing core or CPU may be used to initialize parameters (e.g., frequency of periodic measurement operations, thresholds to compare amplified analog signals to, without limitation) of the circuitry, the circuitry may then be capable of performing the periodic measurement operations independently from intervention or supervision from the CPU. Accordingly, the measurement operations may be periodically performed without interrupting the CPU while the CPU is otherwise engaged, or without enabling the CPU while it is in a disabled state. As a result, valuable power and processing bandwidth may be conserved as compared to embedded systems that require the CPU to enable and disable the op-amp circuit and signal analyzing circuitry. This independence of the circuitry from intervention or supervision from the CPU is also referred to herein as "autonomy" or "autonomous."

In some embodiments circuitry includes timing circuitry configured to assert a first enable signal at a first time and a second enable signal at a second time, the second time following the first time. The circuitry also includes an operational amplifier circuit configured to enable responsive to the assertion of the first enable signal. The operational amplifier circuit is configured to receive an analog input signal and, if enabled, generate an amplified analog input signal responsive to the analog input signal. The circuitry further includes signal analyzing circuitry configured to enable responsive to the assertion of the first enable signal, compare the amplified analog input signal to one or more threshold values responsive to the assertion of the second enable signal, and generate an alert signal responsive to a determination that the amplified analog input signal falls outside of a range of values defined by the one or more threshold values.

In some embodiments a smoke detector system includes a smoke sensor, a first timing circuit, a second timing circuit, an operational amplifier circuit, signal analyzing circuitry, and alarm circuitry. The smoke sensor is configured to generate an analog input signal correlated to a quantity of smoke in a smoke chamber. The first timing circuit is configured to periodically assert a first enable signal. The second timing circuit is configured to periodically assert a second enable signal a predetermined period of time following each assertion of the first enable signal. The operational amplifier circuit is configured to enable responsive to assertions of the first enable signal. The operational amplifier circuit is also configured to receive the analog input signal and, if enabled, generate an amplified analog input signal responsive to the analog input signal. The signal analyzing circuitry is configured to enable responsive to the assertions of the first enable signal, compare the amplified analog input signal to one or more threshold values responsive to the assertion of the second enable signal, and generate an alert signal responsive to a determination that the amplified analog input signal falls outside of a range of values defined by the one or more threshold values. The alarm circuitry is configured to generate an alarm responsive to the alert signal.

In some embodiments a method of measuring an analog input signal includes receiving an analog input signal at an input of an operational amplifier circuit, asserting a first enable signal, activating the operational amplifier circuit responsive to the assertion of the first enable signal to generate an amplified analog input signal at an output of the operational amplifier circuit, and activating signal analyzing circuitry electrically connected to the output of the operational amplifier circuit responsive to the assertion of the first enable signal. The method also includes asserting a second enable signal, determining, by the signal analyzing circuitry, whether the amplified analog input signal is outside of a predetermined range of values defined by one or more threshold values responsive to the assertion of the second enable signal, and generating, by the signal analyzing circuitry, an alert signal responsive to a determination that the amplified analog input signal is outside of the predetermined range of values.

FIG. 1 is a block diagram of circuitry 100 (e.g., a microcontroller) for autonomous measurement of analog signals, according to some embodiments. The circuitry 100 includes timing circuitry 102 configured to assert a first enable signal 122 at a first time and a second enable signal 124 at a second time. The second time follows the first time. The circuitry 100 also includes an operational amplifier circuit (i.e., op-amp circuit 110) including an operational amplifier 112. The op-amp circuit 110 is configured to enable (i.e., enable the op-amp circuit 110 by transitioning from a disabled state to an enabled state) responsive to the assertion of the first enable signal 122 at an enable input of op-amp circuit 110. Op-amp circuit 110 is also configured to receive an analog input signal 126 from an analog input signal source 114 (e.g., a smoke sensor, a passive infrared (PIR) sensor, a temperature sensor, a carbon dioxide sensor, other sensor, without limitation). If enabled, the op-amp circuit 110 is configured to generate an amplified analog input signal 128 responsive to the analog input signal 126. The circuitry 100 also includes signal analyzing circuitry 116 configured to enable responsive to the assertion of the first enable signal 122 (i.e., enable the signal analyzing circuitry 116), compare the amplified analog input signal 128 (e.g., a magnitude of a voltage potential of the amplified analog input signal 128) to one or more threshold values responsive to the assertion of the second enable signal 124, and generate an alert signal 130 responsive to a determination that the amplified analog input signal 128 falls outside of a range of values defined by the one or more threshold values.

In some embodiments the timing circuitry 102 is configured to assert the first enable signal 122 and the second enable signal 124 periodically (e.g., every two seconds). In some embodiments the timing circuitry 102 includes a first timing circuit 104 configured to generate the first enable signal 122 and a second timing circuit 106 configure to generate the second enable signal 124. By way of non-limiting example, the first timing circuit 104 and the second timing circuit 106 may count down from timer values initialized by a central processing unit (CPU) 118. By way of non-limiting example, the first timing circuit 104 may be configured to assert the first enable signal 122 responsive to expiration of a countdown from a first timer value.

In some embodiments a user of the circuitry 100 may configure a frequency of analog measurements by setting a period of assertion (e.g., setting a first timer value), by the first timing circuit 104, of the first enable signal 122, which is provided to the second timing circuit 106. The second timing circuit 106 may count a specific period of time (e.g., count down from a second timer value associated with the second enable signal 124) following assertions of the first enable signal 122 before asserting the second enable signal 124 to provide the op-amp circuit 110 sufficient time to settle its output (i.e., the amplified analog input signal 128) with a stable output value according to its function and input value (i.e., the value of the analog input signal 126). The second timing circuit 106 may also provide the signal analyzing circuitry 116 sufficient time to ready itself (e.g., to power up and/or initialize) before asserting the second enable signal 124.

The timing circuitry 102, the op-amp circuit 110, and the signal analyzing circuitry 116 are all implemented in hardware, in contrast to software or firmware implementations that are executed by the CPU 118. Accordingly, once initialized, the circuitry 100 is configured to perform periodic analog measurements with threshold checks independently from intervention or supervision from the CPU 118.

Figure 2:
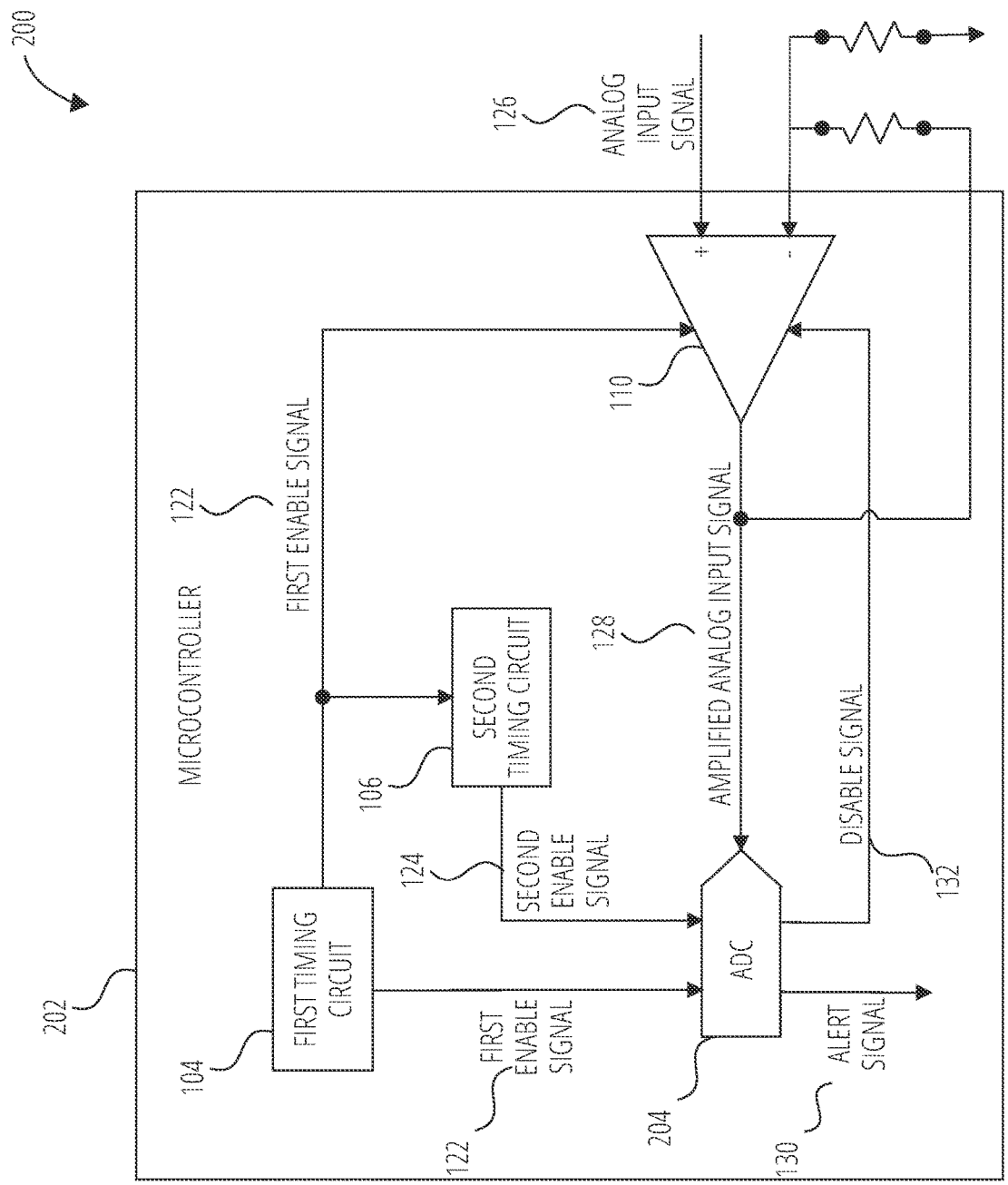
FIG. 2 is a block diagram of circuitry, which is an analog to digital converter (ADC) implementation of the circuitry of FIG. 1.

In some embodiments the signal analyzing circuitry 116 includes an analog to digital converter (ADC) (ADC not shown). FIG. 2 illustrates an example of circuitry 200 that uses an ADC 204 for the signal analyzing circuitry 116.

Figure 3:
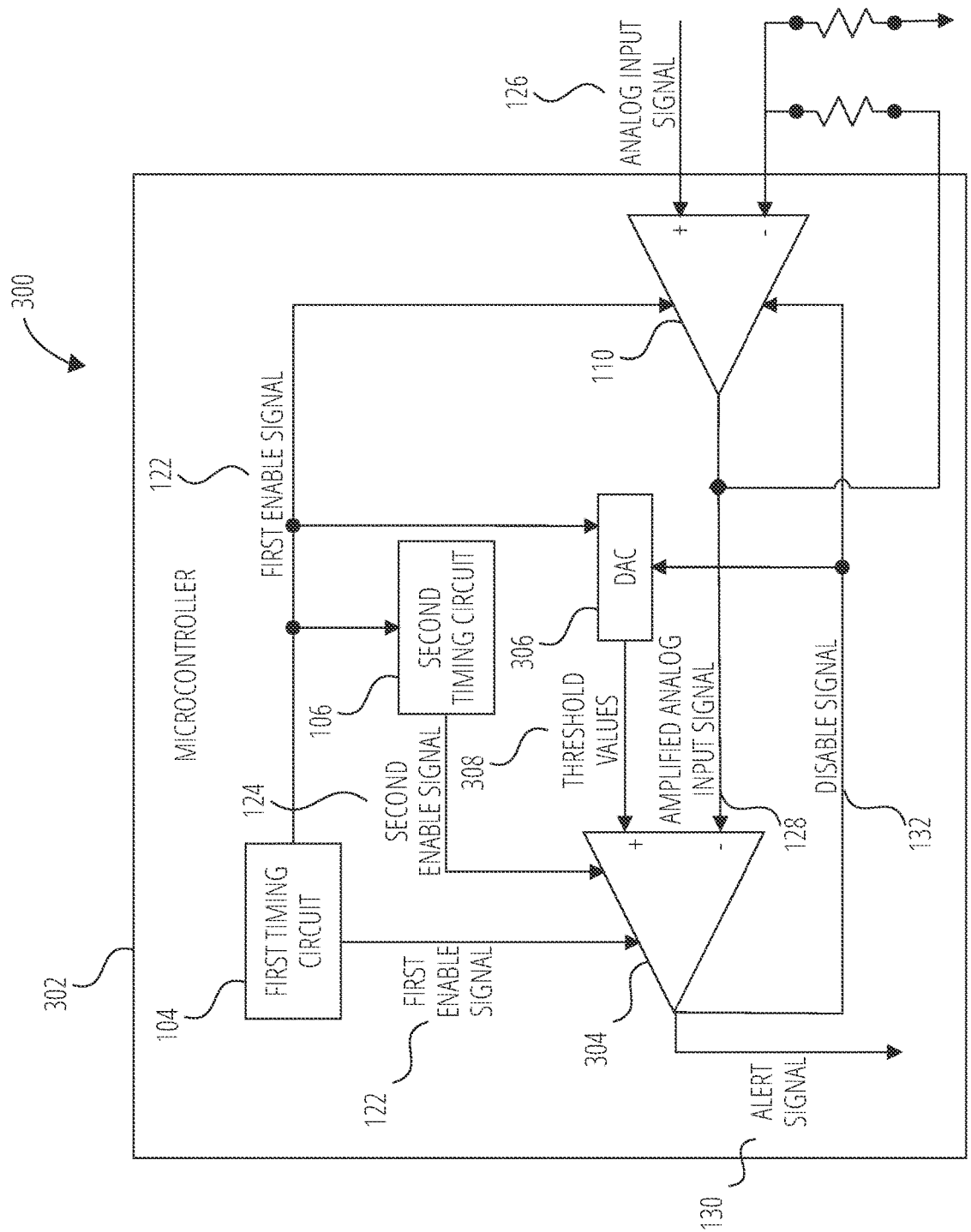
FIG. 3 is a block diagram of circuitry, which is an analog comparator implementation of the circuitry of FIG. 1.

In some embodiments the signal analyzing circuitry 116 includes an analog comparator (analog comparator not shown). In some such embodiments the signal analyzing circuitry 116 further includes a digital to analog converter (DAC) configured to generate one or more reference signals (reference signals not shown) associated with the one or more threshold values (DAC not shown). The analog comparator may be configured to compare the amplified analog input signal 128 to the one or more reference signals (e.g., a magnitude such as voltage potential level of the analog input signal to magnitudes such as voltage potential levels of the reference signals, without limitation). FIG. 3 illustrates an example of circuitry 300 that uses an analog comparator 304 in conjunction with a DAC 306 for the signal analyzing circuitry 116.

In some embodiments the op-amp circuit 110 includes a low-pass filter circuit (e.g., to remove noise from the analog input signal 126, without limitation). In some embodiments the op-amp circuit 110 is configured to amplify the analog input signal 126 to generate the amplified analog input signal 128 that is within a desired range for input to the signal analyzing circuitry 116.

In some embodiments the signal analyzing circuitry 116 is further configured to disable the op-amp circuit 110 and the signal analyzing circuitry 116 after comparing the amplified analog input signal 128 to the one or more threshold values. By way of non-limiting example, the signal analyzing circuitry 116 may be configured to provide a disable signal 132 to the op-amp circuit 110 after comparing the amplified analog input signal 128 to the one or more threshold values. In some embodiments the first enable signal 122, the second enable signal 124, and the disable signal 132 are each arranged as respective pulse signals, with op-amp circuit 110 and signal analyzing circuitry 116 acting responsive to a predetermined edge of the pulse signal.

In some embodiments the circuitry 100 further comprises a central processing unit (CPU) 118 configured to initialize values of the one or more threshold values for signal analyzing circuitry 116 and timing of assertions of the first enable signal 122 and the second enable signal 124 (e.g., first and second timer values associated with the first enable signal 122 and the second enable signal 124, respectively). In some such embodiments, once the values and timing are initialized by the CPU 118 the timing circuitry 102, the op-amp circuit 110, and the signal analyzing circuitry 116 are configured to operate independently from intervention and supervision from the CPU 118. In some embodiments the alert signal 130 includes an interrupt signal 134 configured to interrupt operation of the CPU to take remedial action. Once initialized, the circuitry 100 performs measurements of the analog input signal 126 in a periodic interval. In some embodiments the alert signal 130 includes a peripheral signal 136 configured to trigger remedial action to be taken by a peripheral device 138. In some embodiments the alert signal 130 may include both an interrupt signal 134 and a peripheral signal 136.

In some embodiments the analog input signal 126 is generated by a smoke sensor of a smoke detector. In some embodiments the analog input signal is generated by a PIR sensor.

In some embodiments the circuitry 100 includes clock circuitry 108 configured to generate a clock signal 120, which is fed to timing circuitry 102. In some embodiments the timing circuitry 102 is configured to time assertions of the first enable signal 122 and the second enable signal 124 based on the clock signal 120. In some embodiments the clock circuitry 108 may be integrated into the same chip as the CPU 118. In some embodiments the clock circuitry 108 may be implemented off-chip in a separate device (separate device not shown).

FIG. 2 is a block diagram of circuitry 200, which is an analog to digital converter (ADC) implementation of the circuitry 100 of FIG. 1. The circuitry 200 is implemented using a microcontroller 202, which includes the first timing circuit 104, the second timing circuit 106, and the op-amp circuit 110 of the circuitry 100 of FIG. 1, and which are all implemented in hardware, in contrast to software/firmware. Although not shown, the microcontroller 202 includes the CPU 118 of FIG. 1, which operates as a processing core for the microcontroller 202.

As illustrated in FIG. 2, in place of the signal analyzing circuitry 116 of the circuitry 100 of FIG. 1, the circuitry 200 includes an ADC 204. The ADC 204 is configured to compare the amplified analog input signal 128 with its preconfigured threshold values. The ADC 204 may be configurable as to how many ADC conversions (corresponding to threshold comparisons) the ADC 204 should perform (e.g., selectable in a register). If the amplified analog input signal 128 is above or below a pre-defined threshold, the ADC 204 provides or asserts an alert signal 130. By way of non-limiting example, the alert signal 130 may be an interrupt signal 134 (FIG. 1), which may be provided to the CPU 118 (FIG. 1). Also by way of non-limiting example, the alert signal 130 may be a peripheral signal 136 (FIG. 1) provided to the peripheral device 138 of FIG. 1.

An assertion of the first enable signal 122 enables the op-amp circuit 110, the ADC 204, and the second timing circuit 106. The op-amp circuit 110 and the ADC 204 initiate operation responsive to the assertion of the first enable signal 122, and the second timing circuit 106 asserts the second enable signal 124 after the op-amp circuit 110 and the ADC 204 are initiated. By way of non-limiting example, the second timing circuit 106 may assert the second enable signal 124 a predetermined period of time following the assertion of the first enable signal 122. The predetermined period of time may be selected to provide the op-amp circuit 110 and the ADC 204 sufficient time to initiate operation (e.g., to enable voltage potentials at terminals of the op-amp circuit 110 and the ADC 204 to enter a fully functional state, e.g., to stabilize). The assertion of the second enable signal 124 triggers conversion of the amplified analog input signal 128 by the ADC 204 to provide the alert signal 130. Conversion, by the ADC 204, of the amplified analog input signal 128 may include comparing the amplified analog input signal 128 to one or more threshold values to convert the amplified analog input signal 128 to a digital signal (i.e., the alert signal 130). The ADC 204 may automatically disable the op-amp circuit 110 (e.g., via the disable signal 132, without limitation) and then itself after comparing the amplified analog input signal 128 to the threshold values the configured number of times. The ADC 204 and the op-amp circuit 110 may then remain disabled until the next assertion of the first enable signal 122 from first timing circuit 104.

FIG. 3 is a block diagram of circuitry 300, which is an analog comparator implementation of the circuitry 100 of FIG. 1. The circuitry 300 is implemented using a microcontroller 302, which includes the first timing circuit 104, the second timing circuit 106, and the op-amp circuit 110 of the circuitry 100 of FIG. 1, and which are all implemented in hardware, in contrast to software/firmware. Although not shown, the microcontroller 302 includes the CPU 118 of FIG. 1, which operates as a processing core for the microcontroller 302.

As illustrated in FIG. 3, in place of the signal analyzing circuitry 116 of the circuitry 100 of FIG. 1, the circuitry 300 includes an analog comparator 304 and a DAC 306. The analog comparator 304 and the DAC 306 are configured to enable responsive to an assertion of the first enable signal 122. Enabling of the analog comparator 304 responsive to the first enable signal 122 includes powering up of the analog comparator 304. A predetermined period of time following an assertion of the first enable signal 122 by first timing circuit 104, the second timing circuit 106 asserts the second enable signal 124. The predetermined period of time is selected to provide sufficient time for the analog comparator 304, the op-amp circuit 110, and the DAC 306 to power up and enter a fully functional state. Responsive to the assertion of the second enable signal 124, the analog comparator 304 compares the amplified analog input signal 128 to one or more threshold values 308 provided by the DAC 306 or to another signal (another signal is not shown). In other words, an assertion of the first enable signal 122 initiates power-up of the analog comparator 304, and an assertion of the second enable signal 124 initiates comparing by the analog comparator 304. This may be useful for safety applications to be sure that the op-amp circuit 110 has settled the output value (i.e., the value of the amplified analog input signal 128) according to a value of the analog input signal 126 following enablement responsive to the first enable signal 122.

The analog comparator 304 is a smart comparator that uses a timer (e.g., an internal timer or an external timer, not shown) after the assertion of the second enable signal 124 to determine how long to perform the comparison between the amplified analog input signal 128 and the one or more threshold values 308 provided by the DAC 306. In some embodiments the timer is implemented by the microcontroller 302, and a timer signal (not shown) is provided to the analog comparator 304. The number of clock cycles during which the analog comparator 304 compares the amplified analog input signal 128 to the one or more threshold values 308 may be configurable (e.g., programmable and initialized by the CPU, without limitation). By way of non-limiting example, the timer may be implemented using a register with a down-counter (not shown). The analog comparator 304 (e.g., the down-counter of the timer associated with the analog comparator 304) and/or the DAC 306 may be clocked with a low 30 kilohertz or one kilohertz clock so that it can compare a predetermined number of sample values of the amplified analog input signal 128 to the one or more threshold values 308 provided by the DAC 306. Once the down-counter of the timer associated with the analog comparator 304 expires, the analog comparator 304 may assert a disable signal 132 and transition back to a disabled or sleep state.

While the analog comparator 304 is enabled and actively comparing (i.e., responsive to assertions of both the first enable signal 122 and the second enable signal 124), if the amplified analog input signal 128 is above or below predefined threshold values 308, the analog comparator 304 provides or asserts an alert signal 130. By way of non-limiting example, the alert signal 130 may be an interrupt signal 134, which may be provided to the CPU 118 (FIG. 1). Also by way of non-limiting example, the alert signal 130 may be a peripheral signal 136 provided to the peripheral device 138 of FIG. 1. The analog comparator 304 may automatically disable the op-amp circuit 110 (e.g., via the disable signal 132, without limitation) and then the DAC 306 and itself after comparing the amplified analog input signal 128 to the threshold values 308 for the predetermined number of clock cycles. As previously discussed, a down-counter may count down from a pre-configured value stored in a register responsive to the assertion of the second enable signal 124 and the analog comparator 304 may generate the disable signal 132 responsive to expiration of the countdown. The analog comparator 304, the DAC 306, and the op-amp circuit 110 may then remain disabled until the next assertion of the first enable signal 122.

Figure 4:
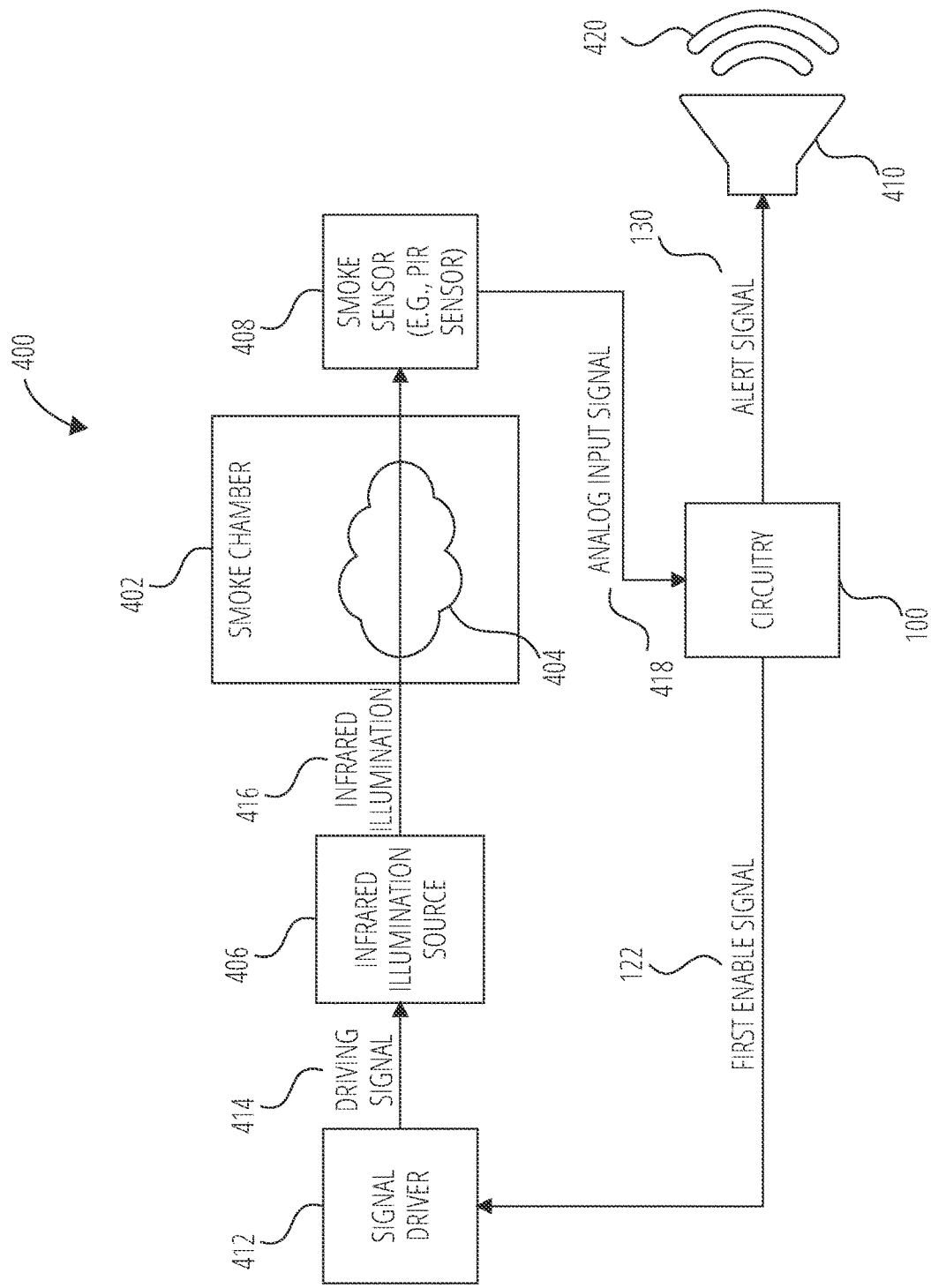
FIG. 4 is a block diagram of a smoke detector system, according to some embodiments.

FIG. 4 is a block diagram of a smoke detector system 400, according to some embodiments. The smoke detector system 400 includes a signal driver 412 electrically connected to an infrared illumination source 406. The signal driver 412 is configured to enable responsive to assertions of a first enable signal 122. When enabled, the signal driver 412 is configured to provide a driving signal 414 to the infrared illumination source 406. The infrared illumination source 406 is configured to illuminate a smoke chamber 402 with infrared illumination 416 responsive to the driving signal 414 (i.e., while the signal driver 412 is enabled). The smoke detector system 400 also includes a smoke sensor 408 (e.g., a PIR sensor) configured to detect the infrared illumination 416 and generate an analog input signal 418 correlated to a quantity of smoke 404 in the smoke chamber 402.

The smoke detector system 400 also includes the circuitry 100 of FIG. 1. Referring to FIG. 1 and FIG. 4 together, the circuitry 100 includes a first timing circuit 104, which in the embodiment of FIG. 4 may be configured to periodically assert the first enable signal 122. Accordingly, the signal driver 412 and the infrared illumination source 406 may be configured to operate in an off or low power state by default to conserve power, then periodically activate responsive to the first enable signal 122. As previously discussed, the circuitry 100 also includes a second timing circuit 106, which in the embodiment of FIG. 4 may be configured to periodically assert a second enable signal 124 a predetermined period of time following assertions of the first enable signal 122. By way of non-limiting example, the second timing circuit 106 may be configured to enable responsive to assertions of the first enable signal 122 and assert the second enable signal 124 the predetermined period of time following the assertions of the first enable signal 122 responsive to the assertions of the first enable signal 122.

As also previously discussed, the circuitry 100 further includes an op-amp circuit 110 and signal analyzing circuitry 116. The op-amp circuit 110 is configured to enable responsive to assertions of the first enable signal 122. The op-amp circuit 110 is configured to receive the analog input signal 418, and, if enabled, generate an amplified analog input signal 128 responsive to the analog input signal 418. The signal analyzing circuitry 116 is configured to enable responsive to the assertions of the first enable signal 122, compare the amplified analog input signal 128 to one or more threshold values responsive to the assertion of the second enable signal 124, and generate an alert signal 130 responsive to a determination that the amplified analog input signal 128 falls outside of a range of values defined by the one or more threshold values. The smoke detector system 400 further includes alarm circuitry 410 configured to generate an alarm 420 responsive to the alert signal 130.

Figure 5:
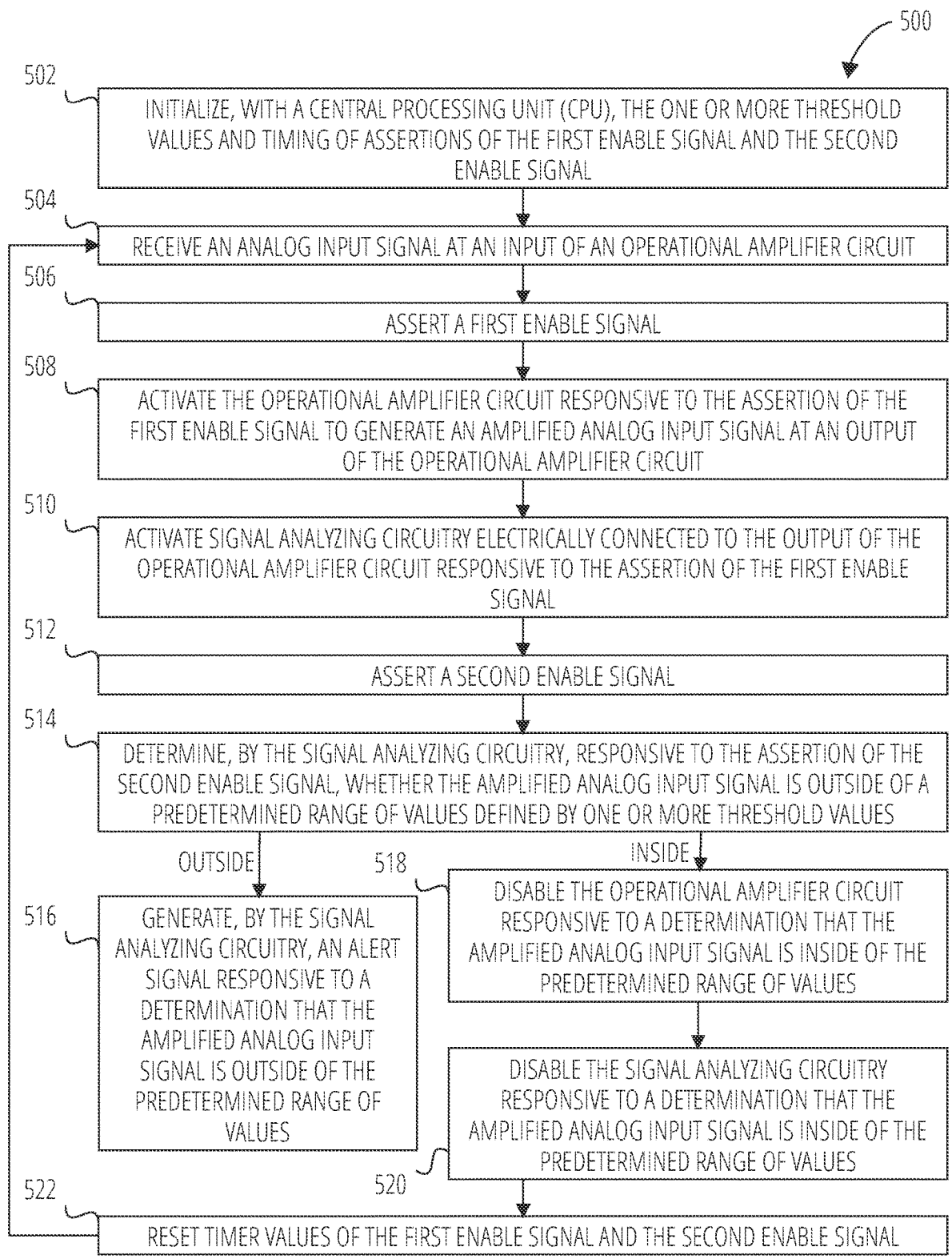
FIG. 5 is a flowchart illustrating a method of measuring an analog input signal, according to some embodiments.

FIG. 5 is a flowchart illustrating a method 500 of measuring an analog input signal (e.g., the analog input signal 126 of FIG. 1, the analog input signal 418 of FIG. 4), according to some embodiments. At operation 502 the method 500 includes initializing, with a CPU (e.g., the CPU 118 of FIG. 1), one or more threshold values and timing of assertions of a first enable signal (e.g., the first enable signal 122 of FIG. 1) and a second enable signal (e.g., second enable signal 124).

At operation 504 the method 500 includes receiving an analog input signal at an input of an operational amplifier circuit (e.g., the op-amp circuit 110 of FIG. 1). In some embodiments receiving the analog input signal at the input of the operational amplifier circuit includes receiving the analog input signal from a smoke sensor (e.g., the smoke sensor 408 of FIG. 4). In some embodiments receiving the analog input signal at the input of the operational amplifier circuit includes receiving the analog input signal from a passive infrared sensor.

At operation 506 the method 500 includes asserting a first enable signal. At operation 508 the method 500 includes activating the operational amplifier circuit responsive to the assertion of the first enable signal to generate an amplified analog input signal (e.g., amplified analog input signal 128 of FIG. 1) at an output of the operational amplifier circuit. By way of non-limiting example, the first enable signal may be asserted responsive to expiration of a countdown from an initialized timer value (e.g., initialized at operation 502).

At operation 510 the method 500 includes activating signal analyzing circuitry (e.g., the signal analyzing circuitry 116 of FIG. 1) electrically connected to the output of the operational amplifier circuit responsive to the assertion of the first enable signal. In some embodiments activating the signal analyzing circuitry includes activating an analog to digital converter (e.g., the ADC 204 of FIG. 2). In some embodiments activating the signal analyzing circuitry includes activating an analog comparator (e.g., the analog comparator 304 of FIG. 3).

At operation 512 the method 500 includes asserting a second enable signal. By way of non-limiting example, the second enable signal may be asserted responsive to expiration of a countdown from an initialized timer value (e.g., initialized at operation 502). In some embodiments asserting the second enable signal includes activating a timing circuit (e.g., the second timing circuit 106 of FIG. 1) configured to provide the second enable signal. By way of non-limiting example, the second timing circuit 106 of FIG. 1 may be configured to assert the second enable signal 124 a predetermined period of time following the first enable signal 122 responsive to the first enable signal 122. In some embodiments asserting the first enable signal and asserting the second enable signal includes periodically asserting the first enable signal and the second enable signal.

At operation 514 the method 500 includes determining, by the signal analyzing circuitry, responsive to the assertion of the second enable signal, whether the amplified analog input signal is outside of a predetermined range of values defined by one or more threshold values. At operation 516 the method 500 includes generating, by the signal analyzing circuitry, an alert signal (e.g., alert signal 130) responsive to a determination that the amplified analog input signal is outside of the predetermined range of values. By way of non-limiting example, alert signal may be configured to trigger the CPU and/or other peripherals to perform remedial action.

At operation 518 the method 500 includes disabling the operational amplifier circuit responsive to a determination that the amplified analog input signal is inside of the predetermined range of values. At operation 520 the method 500 includes disabling the signal analyzing circuitry responsive to a determination that the amplified analog input signal is inside of the predetermined range of values. At operation 522 the method includes resetting timer values of the first enable signal and the second enable signal, and returning to operation 504, receiving the analog input signal at the input of the operation amplifier circuit. By way of non-limiting example, resetting the timer values of the first enable signal and the second enable signal may include resetting the timer values of the first enable signal and the second enable signal to their initializations made at operation 502 (initializing the one or more threshold values and timing of assertions of the first enable signal and the second enable signal). Countdown from the timer values may then commence and the method 500 may proceed to operation 504 (receive the analog input signal at the input of the operational amplifier circuit).

EXAMPLES

A non-exhaustive, non-limiting list of example embodiments follows. Not each of the example embodiments listed below is explicitly and individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1: A circuitry, comprising: a timing circuitry configured to assert a first enable signal at a first time and a second enable signal at a second time, the second time following the first time; an operational amplifier circuit configured to enable responsive to the assertion of the first enable signal, the operational amplifier circuit configured to, if enabled, generate an amplified analog input signal responsive to an analog input signal; and a signal analyzing circuitry configured to: enable responsive to the assertion of the first enable signal; compare the amplified analog input signal to one or more threshold values responsive to the assertion of the second enable signal; and generate an alert signal responsive to a determination that the amplified analog input signal falls outside of a range of values defined by the one or more threshold values.

Example 2: The circuitry of Example 1, wherein the timing circuitry is configured to assert the first enable signal and the second enable signal periodically.

Example 3: The circuitry according to any one of Examples 1 and 2, wherein the signal analyzing circuitry includes an analog to digital converter.

Example 4: The circuitry according to any one of Examples 1 and 2, wherein the signal analyzing circuitry includes an analog comparator.

Example 5: The circuitry of Example 4, wherein the signal analyzing circuitry further includes a digital to analog converter configured to generate one or more reference signals respectively associated with the one or more threshold values, the analog comparator configured to compare the amplified analog input signal to the one or more reference signals.

Example 6: The circuitry according to any one of Examples 1-5, wherein the operational amplifier circuit comprises a low-pass filter to filter the analog input signal.

Example 7: The circuitry according to any one of Examples 1-6, wherein the timing circuitry includes a first timing circuit configured to generate the first enable signal and a second timing circuit configured to generate the second enable signal.

Example 8: The circuitry according to any one of Examples 1-7, wherein the signal analyzing circuitry is further configured to disable the operational amplifier circuit and the signal analyzing circuitry after comparing the amplified analog input signal to the one or more threshold values.

Example 9: The circuitry according to any one of Examples 1-8, further comprising a central processing unit (CPU) configured to initialize values of the one or more threshold values and timing of assertions of the first enable signal and the second enable signal.

Example 10: The circuitry of Example 9, wherein once the values and timing are initialized by the CPU the timing circuitry, the operational amplifier circuit, and the signal analyzing circuitry are configured to operate independently from intervention or supervision from the CPU.

Example 11: The circuitry according to any one of Examples 9 and 10, wherein the alert signal comprises an interrupt signal configured to interrupt operation of the CPU to take remedial action.

Example 12: The circuitry according to any one of Examples 1-11, wherein the alert signal is provided to a peripheral device.

Example 13: The circuitry according to any one of Examples 1-12, wherein the analog input signal is generated by a smoke sensor of a smoke detector.

Example 14: A smoke detector system, comprising: a smoke sensor configured to generate an analog input signal correlated to a quantity of smoke in a smoke chamber; a first timing circuit configured to periodically assert a first enable signal; a second timing circuit configured to periodically assert a second enable signal following assertions of the first enable signal; an operational amplifier circuit configured to enable responsive to assertions of the first enable signal, the operational amplifier circuit configured to receive the analog input signal and, if enabled, generate an amplified analog input signal responsive to the analog input signal; a signal analyzing circuitry configured to: enable responsive to the assertions of the first enable signal; compare the amplified analog input signal to one or more threshold values responsive to the assertion of the second enable signal; and generate an alert signal responsive to a determination that the amplified analog input signal falls outside of a range of values defined by the one or more threshold values; and an alarm circuitry configured to generate an alarm responsive to the alert signal.

Example 15: The smoke detector system of Example 14, wherein the second timing circuit is configured to enable responsive to assertions of the first enable signal and assert the second enable signal following the assertions of the first enable signal.

Example 16: The smoke detector system according to any one of Examples 14 and 15, further comprising a signal driver electrically connected to an infrared illumination source, the signal driver configured to enable responsive to assertions of the first enable signal, the infrared illumination source configured to illuminate the smoke chamber with infrared illumination while the signal driver is enabled, wherein the smoke sensor comprises a passive infrared sensor configured to detect the infrared illumination.

Example 17: A method of measuring an analog input signal, the method comprising: receiving an analog input signal at an input of an operational amplifier circuit; asserting a first enable signal; activating the operational amplifier circuit responsive to the assertion of the first enable signal to generate an amplified analog input signal at an output of the operational amplifier circuit; activating a signal analyzing circuitry electrically connected to the output of the operational amplifier circuit responsive to the assertion of the first enable signal; asserting a second enable signal; determining, by the signal analyzing circuitry, whether the amplified analog input signal is outside of a predetermined range of values defined by one or more threshold values responsive to the assertion of the second enable signal; and generating, by the signal analyzing circuitry, an alert signal responsive to a determination that the amplified analog input signal is outside of the predetermined range of values.

Example 18: The method of Example 17, further comprising: disabling the operational amplifier circuit responsive to a determination that the amplified analog input signal is inside of the predetermined range of values; and disabling the signal analyzing circuitry responsive to a determination that the amplified analog input signal is inside of the predetermined range of values.

Example 19: The method according to any one of Examples 17 and 18, further comprising initializing, with a central processing unit (CPU), the one or more threshold values and timing of assertions of the first enable signal and the second enable signal, wherein the receiving, asserting, activating, activating, asserting, determining and generating operations are performed independently from the CPU after the initializing.

Example 20: The method according to any one of Examples 17-19, wherein receiving the analog input signal at the input of the operational amplifier circuit comprises receiving the analog input signal from a smoke sensor.

Example 21: The method according to any one of Examples 17-20, wherein activating the signal analyzing circuitry comprises activating one of an analog to digital converter and an analog comparator.

Example 22: The method according to any one of Examples 17-21, wherein asserting the second enable signal comprises activating a timing circuit configured to provide the second enable signal.

Example 23: The method according to any one of Examples 17-22, wherein asserting the first enable signal and asserting the second enable signal comprises periodically asserting the first enable signal and the second enable signal.

Example 24: Circuitry, comprising: a timing circuitry configured to assert a first enable signal at a first time and a second enable signal at a second time, the second time following the first time; an operational amplifier circuit configured to enable responsive to the assertion of the first enable signal, the operational amplifier circuit configured to receive an analog input signal and, if enabled, generate an amplified analog input signal responsive to the analog input signal; and signal analyzing circuitry configured to: enable responsive to the assertion of the first enable signal; compare the amplified analog input signal to one or more threshold values responsive to the assertion of the second enable signal; and generate an alert signal responsive to a determination that the amplified analog input signal falls outside of a range of values defined by the one or more threshold values.

Example 25: The circuitry of Example 24, wherein the timing circuitry is configured to assert the first enable signal and the second enable signal periodically.

Example 26: The circuitry according to any one of Examples 24 and 25, wherein the signal analyzing circuitry includes an analog to digital converter.

Example 27: The circuitry according to any one of Examples 24 and 25, wherein the signal analyzing circuitry includes an analog comparator.

Example 28: The circuitry of Example 27, wherein the signal analyzing circuitry further includes a digital to analog converter configured to generate one or more reference signals associated with the one or more threshold values, the analog comparator configured to compare the amplified analog input signal to the one or more reference signals.

Example 29: The circuitry according to any one of Examples 24-28, wherein the operational amplifier circuit comprises a low-pass filter circuit.

Example 30: The circuitry according to any one of Examples 24-29, wherein the timing circuitry includes a first timing circuit configured to generate the first enable signal and a second timing circuit configured to generate the second enable signal.

Example 31: The circuitry according to any one of Examples 24-30, wherein the signal analyzing circuitry is further configured to disable the operational amplifier circuit and the signal analyzing circuitry after comparing the amplified analog input signal to the one or more threshold values.

Example 32: The circuitry according to any one of Examples 24-31, further comprising a central processing unit (CPU) configured to initialize values of the one or more threshold values and timing of assertions of the first enable signal and the second enable signal.

Example 33: The circuitry of Example 32, wherein once the values and timing are initialized by the CPU the timing circuitry, the operational amplifier circuit, and the signal analyzing circuitry are configured to operate independently from intervention from the CPU.

Example 34: The circuitry according to any one of Examples 32 and 33, wherein the alert signal comprises an interrupt signal configured to interrupt operation of the CPU to take remedial action.

Example 35: The circuitry according to any one of Examples 24-34, wherein the alert signal is configured to trigger remedial action to be taken by a peripheral device.

Example 36: The circuitry according to any one of Examples 24-35, wherein the analog input signal is generated by a smoke sensor of a smoke detector.

Example 37: The circuitry according to any one of Examples 24-36, wherein the analog input signal is generated by a passive infrared (PIR) sensor.

Example 38: A smoke detector system, comprising: a smoke sensor configured to generate an analog input signal correlated to a quantity of smoke in a smoke chamber; a first timing circuit configured to periodically assert a first enable signal; a second timing circuit configured to periodically assert a second enable signal a predetermined period of time following assertions of the first enable signal; an operational amplifier circuit configured to enable responsive to assertions of the first enable signal, the operational amplifier circuit configured to receive the analog input signal and, if enabled, generate an amplified analog input signal responsive to the analog input signal; signal analyzing circuitry configured to: enable responsive to the assertions of the first enable signal; compare the amplified analog input signal to one or more threshold values responsive to the assertion of the second enable signal; and generate an alert signal responsive to a determination that the amplified analog input signal falls outside of a range of values defined by the one or more threshold values; and alarm circuitry configured to generate an alarm responsive to the alert signal.

Example 39: The smoke detector system of Example 38, wherein the second timing circuit is configured to enable responsive to assertions of the first enable signal and assert the second enable signal the predetermined period of time following the assertions of the first enable signal responsive to the assertions of the first enable signal.

Example 40: The smoke detector system according to any one of Examples 38 and 39, wherein the signal analyzing circuitry comprises an analog to digital converter.

Example 41: The smoke detector system according to any one of Examples 38 and 39, wherein the signal analyzing circuitry comprises an analog comparator.

Example 42: The smoke detector system according to any one of Examples 38-41, further comprising a signal driver electrically connected to an infrared illumination source, the signal driver configured to enable responsive to assertions of the first enable signal, the infrared illumination source configured to illuminate the smoke chamber with infrared illumination while the signal driver is enabled, wherein the smoke sensor comprises a passive infrared (PIR) sensor configured to detect the infrared illumination.

Example 43: A method of measuring an analog input signal, the method comprising: receiving an analog input signal at an input of an operational amplifier circuit; asserting a first enable signal; activating the operational amplifier circuit responsive to the assertion of the first enable signal to generate an amplified analog input signal at an output of the operational amplifier circuit; activating signal analyzing circuitry electrically connected to the output of the operational amplifier circuit responsive to the assertion of the first enable signal; asserting a second enable signal; determining, by the signal analyzing circuitry, whether the amplified analog input signal is outside of a predetermined range of values defined by one or more threshold values responsive to the assertion of the second enable signal; and generating, by the signal analyzing circuitry, an alert signal responsive to a determination that the amplified analog input signal is outside of the predetermined range of values.

Example 44: The method of Example 43, further comprising: disabling the operational amplifier circuit after determining whether the amplified analog input signal is outside of a predetermined range of values; and disabling the signal analyzing circuitry after determining whether the amplified analog input signal is outside of a predetermined range of values.

Example 45: The method according to any one of Examples 43 and 44, further comprising initializing, with a central processing unit (CPU), the one or more threshold values and timing of assertions of the first enable signal and the second enable signal, wherein the receiving, asserting, activating, activating, asserting, determining and generating operations are performed autonomously and independently from the CPU after the initializing.

Example 46: The method according to any one of Examples 43-45, wherein receiving the analog input signal at the input of the operational amplifier circuit comprises receiving the analog input signal from a smoke sensor.

Example 47: The method according to any one of Examples 43-46, wherein receiving the analog input signal at the input of the operational amplifier circuit comprises receiving the analog input signal from a passive infrared sensor.

Example 48: The method according to any one of Examples 43-47, wherein activating the signal analyzing circuitry comprises activating an analog to digital converter.

Example 49: The method according to any one of Examples 43-47, wherein activating the signal analyzing circuitry comprises activating an analog comparator.

Example 50: The method according to any one of Examples 43-49, wherein asserting the second enable signal comprises activating a timing circuit configured to provide the second enable signal.

Example 51: The method according to any one of Examples 43-50, wherein asserting the first enable signal and asserting the second enable signal comprises periodically asserting the first enable signal and the second enable signal.

Example 52: A circuitry, comprising: an operational amplifier circuit configured to enable responsive to signal assertions at an enable pin of the operational amplifier circuit, and while enabled to generate an amplified analog input signal responsive to an analog input signal; signal analyzing circuitry configured to setup responsive to signal assertions at a first enable pin of the signal analyzing circuitry and enable responsive to signal assertions at a second enable pin of the signal analyzing circuitry, and while enabled to: compare the amplified analog input signal to one or more threshold values; and generate an alert signal responsive to a determination that the amplified analog input signal falls outside of a range of values defined by the one or more threshold values, and timing circuitry configured to:

assert a first enable signal at the input of the operational amplifier circuit and the first enable pin of the signal analyzing circuitry responsive to a first time; and assert a second enable signal at the second enable pin of the signal analyzing circuitry responsive to a second time, wherein the second time follows the first time.

CONCLUSION

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
a signal analyzing circuitry to:
   be enabled responsive to an assertion of a first enable signal;
   compare an amplified analog input signal to one or more threshold values responsive to an assertion of a second enable signal, the assertion of the second enable signal following the assertion of the first enable signal; and
   generate an alert signal responsive to a determination that the amplified analog input signal falls outside of a range of values defined by the one or more threshold values; and
a central processing unit (CPU) to provide timer values associated with timing of assertions of the first enable signal and the second enable signal, wherein the signal analyzing circuitry to perform, using the one or more threshold values and the timer values, periodic analog measurements with threshold checks independently from intervention or supervision from the CPU.

2. The apparatus of claim 1, comprising:
a timing circuitry to assert the first enable signal at a first time and the second enable signal at a second time, the second time following the first time.

3. The apparatus of claim 2, wherein the timing circuitry to assert the first enable signal and the second enable signal periodically.

4. The apparatus of claim 2, wherein the timing circuitry includes a first timing circuit to generate the first enable signal and a second timing circuit to generate the second enable signal.

5. The apparatus of claim 4, wherein the first timing circuit to assert the first enable signal responsive to expiration of a countdown from a first timer value of the timer values.

6. The apparatus of claim 1, wherein the signal analyzing circuitry includes an analog to digital converter.

7. The apparatus of claim 1, wherein the signal analyzing circuitry includes an analog comparator.

8. The apparatus of claim 7, wherein the signal analyzing circuitry includes a digital to analog converter to generate one or more reference signals respectively associated with the one or more threshold values, the analog comparator to compare the amplified analog input signal to the one or more reference signals.

9. The apparatus of claim 1, comprising:
an operational amplifier circuit to enable responsive to the assertion of the first enable signal, the operational amplifier circuit to, if enabled, generate an amplified analog input signal responsive to an analog input signal.

10. The apparatus of claim 9, wherein the operational amplifier circuit comprises a low-pass filter to filter the analog input signal.

11. The apparatus of claim 9, wherein the operational amplifier circuit and the signal analyzing circuitry are disabled for a majority of a time during the periodic analog measurements.

12. The apparatus of claim 9, wherein the signal analyzing circuitry to disable the operational amplifier circuit and the signal analyzing circuitry after comparing the amplified analog input signal to the one or more threshold values.

13. The apparatus of claim 1, wherein the alert signal comprises an interrupt signal to interrupt operation of the CPU to take remedial action.

14. The apparatus of claim 1, wherein the alert signal is provided to a peripheral device.

15. The apparatus of claim 1, wherein the analog input signal is generated by a smoke sensor of a smoke detector.

16. A method, comprising:
activating a signal analyzing circuitry responsive to an assertion of a first enable signal;
determining, by the signal analyzing circuitry, whether an amplified analog input signal is outside of a predetermined range of values defined by one or more threshold values responsive to an assertion of a second enable signal;
generating, by the signal analyzing circuitry, an alert signal responsive to a determination that the amplified analog input signal is outside of the predetermined range of values;
providing, via a Central Processing Unit (CPU), timer values associated with timing of assertions of the first enable signal and the second enable signal; and
performing, using the one or more threshold values and the timer values, periodic analog measurements with threshold checks independently from intervention or supervision from the CPU.

17. The method of claim 16, comprising:
disabling the signal analyzing circuitry responsive to the determination that the amplified analog input signal is inside of the predetermined range of values.

18. The method of claim 17, comprising initializing, with the CPU, the one or more threshold values and timing of assertions of the first enable signal and the second enable signal, wherein the determining, generating, performing, and asserting operations are performed independently from the CPU after the initializing.

19. The method of claim 16, comprising:
receiving an analog input signal at an input of an operational amplifier circuit; and
activating the operational amplifier circuit responsive to the assertion of the first enable signal to generate an amplified analog input signal at an output of the operational amplifier circuit.

20. The method of claim 19, wherein receiving the analog input signal at the input of the operational amplifier circuit comprises receiving the analog input signal from a smoke sensor.

21. The method of claim 19, wherein activating the signal analyzing circuitry comprises activating one of an analog to digital converter and an analog comparator.

22. The method of claim 19, comprising asserting the second enable signal, wherein asserting the second enable signal comprises activating a timing circuit to provide the second enable signal.

23. The method of claim 17, comprising asserting the first enable signal, wherein asserting the first enable signal and asserting the second enable signal comprises periodically asserting the first enable signal and the second enable signal.

\* \* \* \* \*